United States Patent
He et al.

(10) Patent No.: US 9,947,791 B2
(45) Date of Patent: Apr. 17, 2018

(54) FINFET WITH MERGE-FREE FINS

(71) Applicant: GLOBALFOUNDRIES INC., Grand Cayman (KY)

(72) Inventors: Hong He, Schenectady, NY (US); Chiahsun Tseng, Wynantskill, NY (US); Junli Wang, Singerlands, NY (US); Chun-chen Yeh, Clifton Park, NY (US); Yunpeg Yin, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/965,322

(22) Filed: Aug. 13, 2013

(65) Prior Publication Data

US 2014/0170825 A1 Jun. 19, 2014

Related U.S. Application Data

(63) Continuation of application No. 13/713,842, filed on Dec. 13, 2012, now abandoned.

(51) Int. Cl.
| | |
|---|---|
| *H01L 29/78* | (2006.01) |
| *H01L 29/66* | (2006.01) |
| *H01L 29/423* | (2006.01) |
| *H01L 29/786* | (2006.01) |
| *H01L 29/06* | (2006.01) |

(52) U.S. Cl.
CPC ........ *H01L 29/785* (2013.01); *H01L 29/0673* (2013.01); *H01L 29/42392* (2013.01); *H01L 29/66795* (2013.01); *H01L 29/78696* (2013.01)

(58) Field of Classification Search
CPC ......... H01L 29/7855; H01L 2029/7858; H01L 29/66795; H01L 29/785; H01L 21/823431; H01L 21/8845; H01L 21/845; H01L 27/0886; H01L 27/0924; H01L 27/10826; H01L 29/42392; H01L 21/823821
USPC ........... 438/183, 283; 257/E21.444, E21.453
See application file for complete search history.

(56) References Cited

U.S. PATENT DOCUMENTS

| | | | |
|---|---|---|---|
| 6,987,289 B2 | 1/2006 | Nowak | |
| 7,635,632 B2 | 12/2009 | Yeo et al. | |
| 7,763,531 B2 | 7/2010 | Abadeer et al. | |
| 7,960,791 B2 | 6/2011 | Anderson et al. | |

(Continued)

FOREIGN PATENT DOCUMENTS

CN          102820230          12/2012

OTHER PUBLICATIONS

Nandi et al, "Impact of dual-k spacer on analog performance of underlap FinFET", Jun. 4, 2012, vol. 43, pp. 883-887.*

(Continued)

*Primary Examiner* — Daniel Whalen
*Assistant Examiner* — Suberr Chi
(74) *Attorney, Agent, or Firm* — Michael LeStrange; Andrew M. Calderon; Roberts Mlotkowski Safran Cole & Calderon, P.C.

(57) ABSTRACT

A semiconductor device comprises an insulation layer, an active semiconductor layer formed on an upper surface of the insulation layer, and a plurality of fins formed on the insulation layer. The fins are formed in the gate and spacer regions between a first source/drain region and second source/drain region, without extending into the first and second source/drain regions.

18 Claims, 29 Drawing Sheets

(56) References Cited

U.S. PATENT DOCUMENTS

| | | | |
|---|---|---|---|
| 8,169,027 B2 | 5/2012 | Doyle et al. | |
| 8,207,038 B2 | 6/2012 | Cheng et al. | |
| 2007/0254435 A1* | 11/2007 | Orlowski | H01L 29/66545 438/259 |
| 2010/0072553 A1* | 3/2010 | Xu | H01L 21/823807 257/369 |
| 2010/0133614 A1 | 6/2010 | Beyer et al. | |
| 2010/0297816 A1* | 11/2010 | Bedell | B82Y 10/00 438/151 |
| 2010/0308381 A1 | 12/2010 | Luning et al. | |
| 2011/0049583 A1 | 3/2011 | Lin et al. | |
| 2011/0049629 A1 | 3/2011 | Ishikawa et al. | |
| 2011/0133162 A1 | 6/2011 | Bangsaruntip et al. | |
| 2011/0278543 A1 | 11/2011 | Bangsaruntip et al. | |
| 2011/0303983 A1 | 12/2011 | Basker et al. | |
| 2011/0315950 A1 | 12/2011 | Sleight et al. | |
| 2012/0025316 A1 | 2/2012 | Schultz | |
| 2012/0043610 A1 | 2/2012 | Cheng et al. | |
| 2012/0068264 A1 | 3/2012 | Cheng et al. | |
| 2012/0193712 A1 | 8/2012 | Bryant et al. | |
| 2012/0306002 A1 | 12/2012 | Yeh et al. | |
| 2012/0313170 A1* | 12/2012 | Chang | H01L 29/66545 257/347 |
| 2013/0200470 A1* | 8/2013 | Liu | H01L 29/66795 257/408 |
| 2013/0214357 A1* | 8/2013 | Chang | H01L 29/66545 257/347 |
| 2014/0167162 A1 | 6/2014 | He et al. | |

OTHER PUBLICATIONS

International Search Report for corresponding PCT Application No. PCT/US2013/63794, dated Feb. 24, 2014, pp. 1-3.

Written Opinion for corresponding PCT Application No. PCT/US2013/63794, dated Feb. 24, 2014, pp. 1-5.

V. S. Basker et al., A 0.063 μm2 FinFET SRAM cell demonstration with conventional lithography using a novel integration scheme with aggressively scaled fin and gate pitch, 2010 Symposium on VLSI Technology (VLSIT), Jun. 15-17, 2010, pp. 19-20.

T. Yamashita et al., •Sub-25nm FinFET with advanced fin formation and short channel effect engineering,• 2011 Symposium on VLSI Technology (VLSIT), Jun. 14-16, 2011, pp. 14-15.

K. Maitra et al., •Aggressively Scaled Strained-Silicon-on-Insulator Undoped-Body High-k/Metal-Gate nFinFETs for High-Performance Logic Applications,• IEEE Electron Device Letters, vol. 32, Issue 6, Jun. 2011, pp. 713-715.

H. He et al., "FinFET with merge-free fins," U.S. Appl. No. 13/713,842, filed Dec. 13, 2012. US 2014-0167162 A1.

M. Guillorn, et al., "FinFET Performance Advantage at 22nm: An AC Perspective," IEEE Symposium on VLSI Technology Digest of Technical Papers, Jun. 2008, pp. 1-2.

Taiwanese Search Report for related Application No. 102139358 dated Apr. 27, 2016; 1 page.

Taiwanese Office Action for related Application No. 102139358 dated Apr. 27, 2016; 7 pages.

* cited by examiner

FINFET WITH MERGE-FREE FINS

CROSS-REFERENCE TO RELATED APPLICATION

This application is a continuation of U.S. patent application Ser. No. 13/713,842, filed Dec. 13, 2012, the disclosure of which is incorporated by reference herein in its entirety.

BACKGROUND

The invention relates to a semiconductor device, and more particularly, to patterning fins of a FinFET semiconductor device.

Interests in multi-gate MOSFETs have significantly increased as the industry continues to demand smaller sized MOSFET devices. One such device that is capable of maintaining industry performance standards at a reduced size is the FinFET.

A conventional FinFET includes one or more fins that are patterned on a substrate, such as a silicon-on-insulator (SOI). For example, a conventional sidewall image transfer (SIT) process can be used to form a dense array of fins, which extend into the source/drain (S/D) regions of the FinFET. Conventional FinFET fabrication requires an epitaxy (EPI) process to merge the fins formed in the S/D regions. However, this process causes undesirable gaps between the fins, and may also create source/drain shorting issues at the gate line ends if the EPI process is not properly controlled.

Moreover, conventional fabrication processes perform gate patterning for forming a gate after forming the fins. The gate patterning utilizes hardmasks, and performs additional spacer etching processes. However, the fins may be inadvertently eroded during the gate and spacer etching processes.

SUMMARY

According to an exemplary embodiment, a semiconductor device having a gate region comprises an insulation layer extending along a first direction to define a length and a second direction perpendicular to the first direction to define a width. The insulation layer has a gate insulation region disposed between first and second non-gate insulation regions that are different from the gate insulation region. An active semiconductor layer is formed on an upper surface of the insulation layer, and a plurality of fins is formed on the gate and spacer regions and between the first and second non-gate insulation regions.

In another exemplary embodiment, a semiconductor device has first and second non-gate regions. The semiconductor device comprises a semiconductor substrate including an active semiconductor layer disposed on an insulation layer, and has a gate pocket formed between the first and second non-gate regions. The gate pocket extends through the active semiconductor layer and the insulation layer to define a recessed gate insulation region. A plurality of fins are supported by walls of the recessed gate insulation region and are disposed a predetermined distance above the recessed gate insulation layer to define a void beneath each fin among the plurality of fins.

In yet another exemplary embodiment, a method of fabricating a semiconductor device comprises forming an insulation layer having a length extending along a first direction and a width extending along a second direction perpendicular to the first direction. The insulation layer has a gate insulation region located between first and second non-gate insulation regions. The method further includes forming an active semiconductor layer on an upper surface of the insulation layer, and forming a plurality of fins at the gate and spacer regions and between the first and second non-gate insulation regions.

In still another exemplary embodiment, a method of forming a semiconductor device having first and second non-gate regions comprises forming an active semiconductor layer disposed on an insulation layer, forming a gate pocket through the active semiconductor layer and the insulation layer to define a recessed gate insulation region between the first and second non-gate regions, forming a plurality of fins supported by walls of the gate pocket. The method further includes removing a portion of the recessed gate insulation region located beneath the plurality of fins to define a void between each fin among the plurality of fins and the recessed gate insulation region.

In still another exemplary embodiment of the present teachings, a method of fabricating a semiconductor device comprises forming a semiconductor substrate including a plurality of layers and having a gate region located between first and second non-gate regions that are different from the gate region. The method further includes forming a gate pocket at the gate region that extends through the plurality of layers, and forming a plurality of fins in the gate pocket such that each fin among the plurality of fins is isolated from the first and second non-gate regions.

In another exemplary embodiment, a method of fabricating semiconductor device comprises forming an insulation layer having a length extending along a first direction and a width extending along a second direction perpendicular to the first direction. The insulation layer has a gate insulation region disposed between first and second non-gate insulation regions. The method further includes forming an active semiconductor layer on an upper surface of the insulation layer. The method further includes forming a plurality of fins at the gate insulation region and between the first and second non-gate insulation regions.

In still another embodiment, a method of forming a semiconductor device having first and second non-gate regions comprises forming an active semiconductor layer disposed on an insulation layer. The method further includes forming a gate pocket through the active semiconductor layer and the insulation layer to define a recessed gate insulation region between the first and second non-gate regions. The method further includes forming a plurality of fins supported by walls of the gate pocket. The method further includes removing a portion of the recessed gate insulation region located beneath the plurality of fins to define a void between each fin among the plurality of fins and the recessed gate insulation region.

Additional features and utilities are realized through the techniques of the present teachings. Other exemplary embodiments and features of the teachings are described in detail herein and are considered a part of the claimed teachings. For a more detailed description of the teachings and features, drawings and descriptions of the exemplary embodiments are presented below.

BRIEF DESCRIPTION OF THE SEVERAL VIEWS OF THE DRAWINGS

The subject matter describing exemplary embodiments of the teachings is particularly pointed out and distinctly claimed in the claims at the conclusion of the specification. The forgoing and other features, and utilities of the teachings are apparent from the following detailed description taken in conjunction with the accompanying drawings in which:

FIGS. 1-27 are a series of views illustrating a method of forming a finFET device according to exemplary embodiments of the present teachings, in which:

FIG. 2 is a cross sectional view illustrating patterning of the SiO$_2$ masking layer to form a gate pocket;

FIG. 3 is a top view of the structure of FIG. 2, following transfer of the SiO$_2$ masking layer patterning into the SOI layer to define semiconductor fins in the gate pocket;

DETAILED DESCRIPTION

Figure 1A:
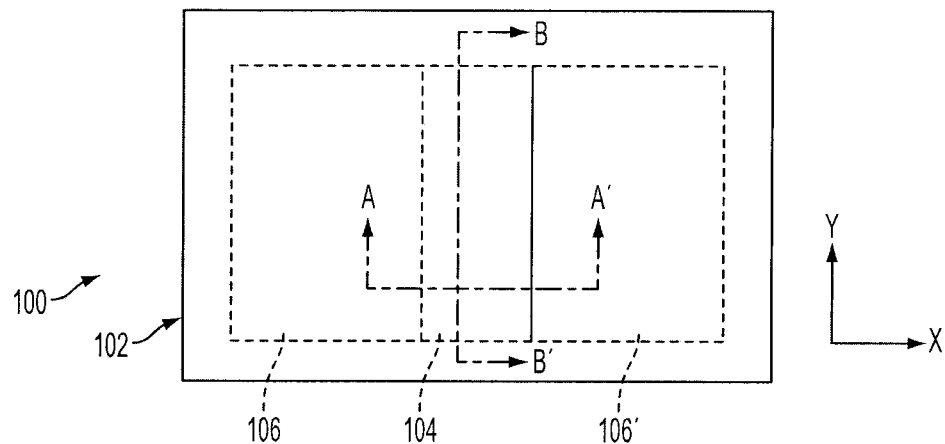
FIG. 1A is a top view illustrating a SiO$_2$ masking layer formed atop a starting substrate.
Figure 1B:
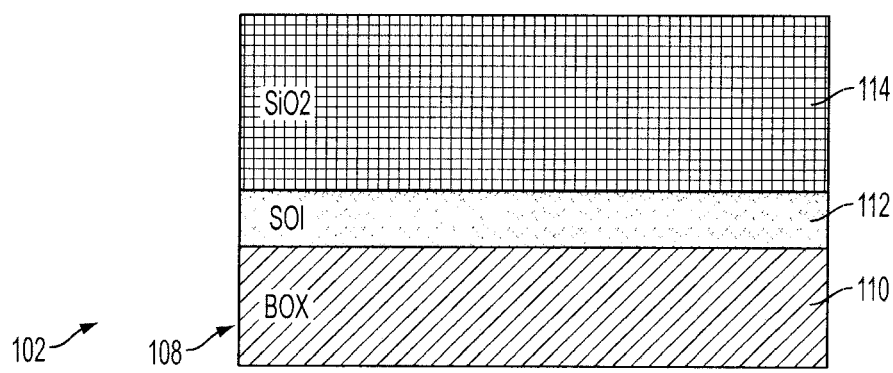
FIG. 1B is a cross sectional view of the starting substrate illustrated in FIG. 1A taken along the lines A-A' illustrating the formation of the SiO$_2$ masking layer atop an SOI layer.

FIGS. 1A-1B illustrate a semiconductor structure 100 according to an exemplary embodiment. The semiconductor structure 100 includes a semiconductor substrate 102 generally indicated. The semiconductor substrate 102 may extend along an X-axis to define a length, and a Y-axis perpendicular to the X-axis to define a width. The semiconductor substrate 102 may include a gate region 104 disposed between first and second non-gate regions 106/106'. In at least one exemplary embodiment, the first and second non-gate regions 106/106' include first and second source/drain (S/D) regions. That is, the first non-gate region 106 may correspond to a source region and the second non-gate region 106' may correspond to a drain region. The non-gate regions 106/106' may also include regions identified as future source/drain regions to be effected via a future doping procedure, and/or regions that have already undergone a doping procedure to effect S/D regions. Accordingly, the non-gate regions 106/106' will hereinafter be referred to as S/D regions 106/106'.

Exemplary embodiments here on out illustrate the semiconductor substrate 102 as a silicon-on-insulator (SOI) wafer. However, it can also be appreciated that other semiconductor substrates may be used. For example, the semiconductor substrate 102 may include, but is not limited to, a bulk semiconductor substrate comprising silicon, germanium, silicon germanium, silicon carbide, or a III-V compound semiconductor (e.g., GaAs), and a II-VI compound semiconductors (e.g., ZnSe). In addition, an entire semiconductor substrate 102, or a portion thereof, may be amorphous, polycrystalline, or single-crystalline. The aforementioned types of semiconductor substrates 102 may also include a hybrid oriented (HOT) semiconductor substrate, which provides surface regions of different crystallographic orientation. The semiconductor substrate 102 may be doped, undoped or contain doped regions and undoped regions therein. Further, the semiconductor substrate 102 may be strained, unstrained, contain regions of strain and no strain therein, or contain regions of tensile strain and compressive strain.

FIGS. 1-14 illustrate a flow process of forming a semiconductor structure 100, such as a FinFET device, according to an exemplary embodiment of present teachings. Referring to FIG. 1B, the semiconductor substrate 102 may be formed as a silicon-on-insulator (SOI) wafer 108. The SOI wafer 108 includes a buried insulator layer 110 formed on a bulk layer (not shown), an active SOI layer 112 such as silicon, and a masking layer 114.

The buried insulator layer 110 may be a buried oxide (BOX) layer 110 that separates and electrically isolates the bulk layer from the SOI layer 112. The buried insulator layer 110 may have a thickness ranging from about 20 nanometers (nm) to about 200 nanometers (nm). The active SOI layer 112 is disposed between the buried insulator layer 110 and the masking layer 114, and may have a thickness of about 30 nanometers (nm). The masking layer 114 is formed on an upper surface of the active SOI layer 112 to provide a hardmask or covering. The masking layer 114 may be made of a dielectric including, for example, silicon dioxide ($SiO_2$).

Figure 2:
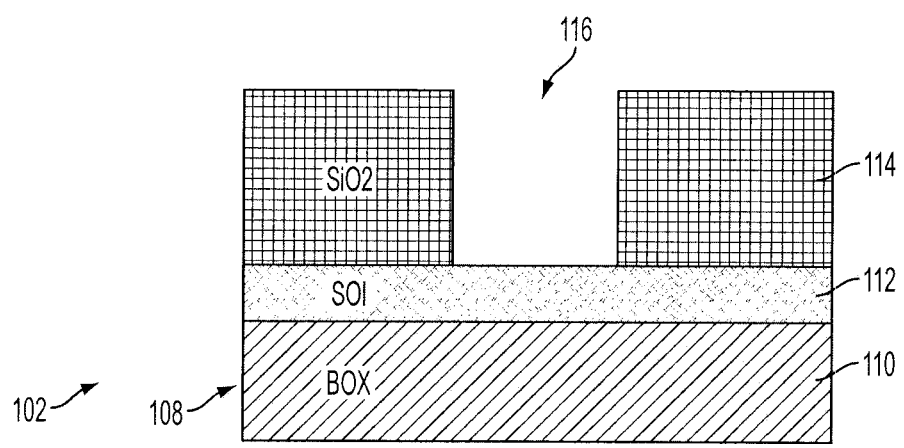

Referring to FIG. 2, a cross sectional view illustrates patterning of the masking layer 114 to form a gate pocket 116 formed in the gate region 104. More specifically, the gate pocket 116 may be formed in the gate region 104 located between the first and second S/D regions 106/106', and through the masking layer 114, to expose the SOI layer 112. The gate pocket 116 may extend through the masking layer 114 and stop at the active SOI layer 112. The gate pocket may also extend through the SOI layer 112, as discussed in greater detail below. Various etching methods may be used to form the gate pocket 116 including, but not limited to, sidewall image transfer (SIT) or pitch split processing.

Figure 3:
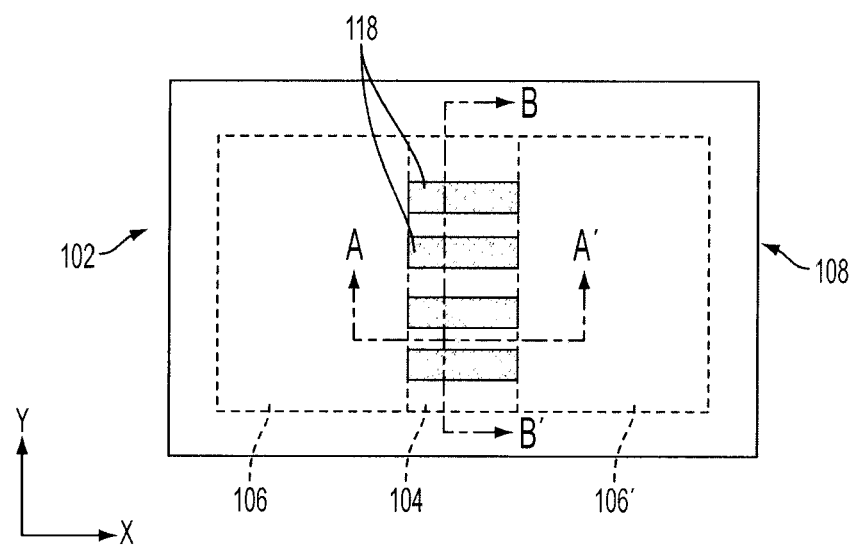

FIG. 3 is a top view of the semiconductor substrate 102 of FIG. 2, following transfer of the masking layer 114 patterning into the SOI layer 112 to define a plurality of semiconductor fins 118 in the gate pocket 116. Although a plurality of fins 118 is formed, a single fin may be formed on the buried insulator layer 110. The fins 118 may be made of a single crystal semiconductor shape, and may be formed to have bodies of various shapes. For example, the fins 118 may have narrow fin bodies extending parallel to the width of the substrate in the X-axis direction, and sidewalls projecting vertically from the buried insulator layer. Further, the fins 118 may be made of single crystal semiconductor material.

The fins 118 may be formed using various conventional processes including, but not limited to, optical lithographic process, e-beam lithographic processes, trimming processes such as, for example, resist trimming, hard mask trimming or oxidation trimming, and a combination thereof. In at least one exemplary embodiment of the present teachings, the fins 118 are formed using a sidewall image transfer (SIT) process.

Figure 4A:
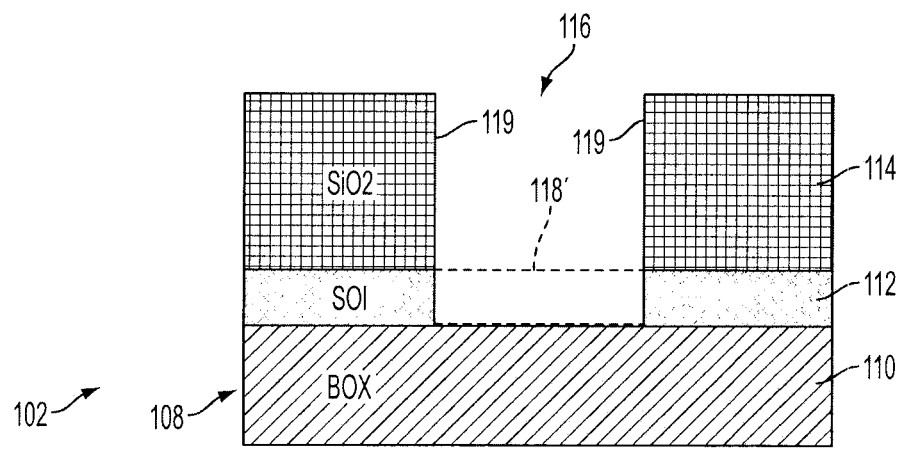
FIG. 4A is a cross sectional view in a first orientation taken along the lines A-A' of FIG. 3.
Figure 4B:
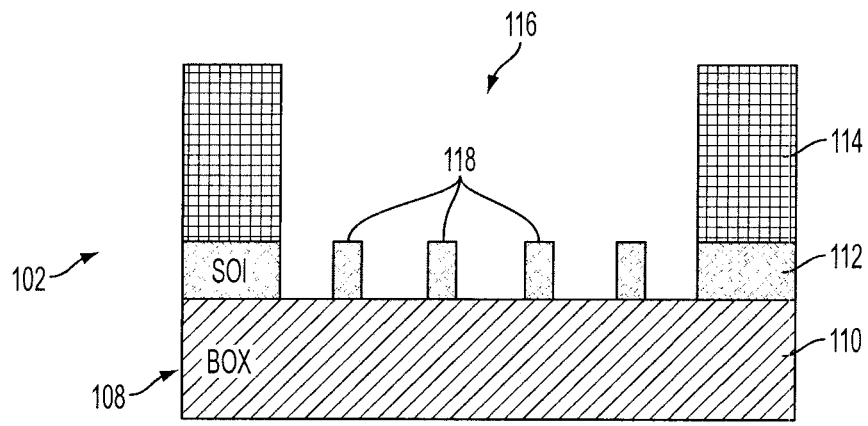
FIG. 4B is a cross sectional view in a second orientation taken along the lines B-B' of FIG. 3.

As illustrated in FIGS. 4A-4B, the plurality of fins 118 are formed in the gate pocket 116 of the SOI wafer 108, and between the first and second S/D regions 106/106'. Accordingly, walls 119 formed by the gate pocket 116 may isolate the plurality of fins 118 from the first and second S/D regions 106/106'.

More specifically, FIG. 4A is a cross-sectional view of the SOI wafer 108 illustrated in FIG. 3 taken along section A-A'. A single fin 118' among the plurality of fins 118 is illustrated in phantom. The fin 118' is formed in the gate pocket 116, and extends in a lengthwise direction along the X-axis between the first and second S/D regions 106/106' to define a length thereof. The length of the fin 118 may range from about 2 nanometers (nm) to about 50 nanometers (nm). In one embodiment, the length of fin varies from 10 nm to 40 nm.

FIG. 4B is a cross-sectional view of the SOI wafer 108 taken along section B-B' of the SOI wafer 108 illustrated in FIG. 3. The plurality of fins 118 is arranged in an array that extends along the widthwise direction of the SOI wafer 108, i.e., the Y-axis. Each single fin 118' extends along the Y-axis to define a width thereof. The width of each fin 118' may range from about 3 nanometers to about 20 nanometers. Further, a distance between each single fin 118' in the Y-axis direction defines a fin pitch. At least one exemplary embodiment provides a fin pitch corresponding to the plurality of fins 118 ranging from about 8 nanometers (nm) to about 50 nanometers (nm). Accordingly, by forming the fins 118 in the gate pocket 116 and between the first and second S/D regions 106/106', fin erosion during gate and spacer patterning processes may be avoided. Moreover, at least one exemplary embodiment of the present teachings provides forming fins 118 in only the gate pocket 116 of the gate region 104, and not the S/D regions 106/106'. As a result, an epitaxy (EPI) process for merging fins located in the S/D regions may be eliminated as discussed in greater detail below.

Figure 5A:
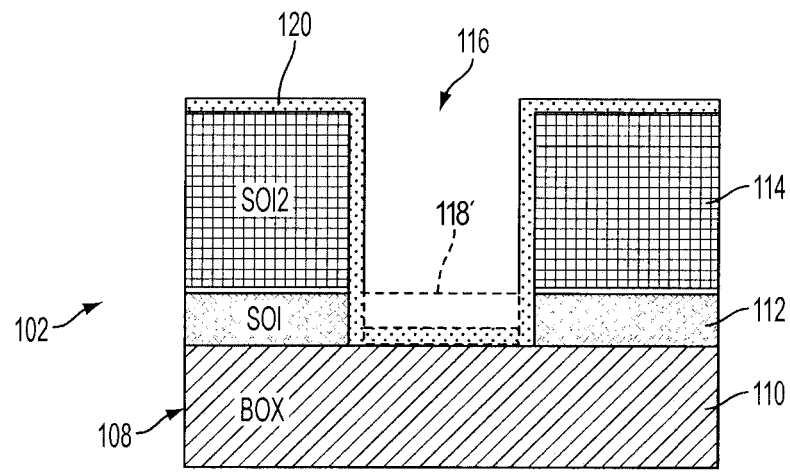
FIG. 5A is a cross sectional view in the first orientation illustrating the formation of a spacer layer over the device shown in FIG. 4A.
Figure 5B:
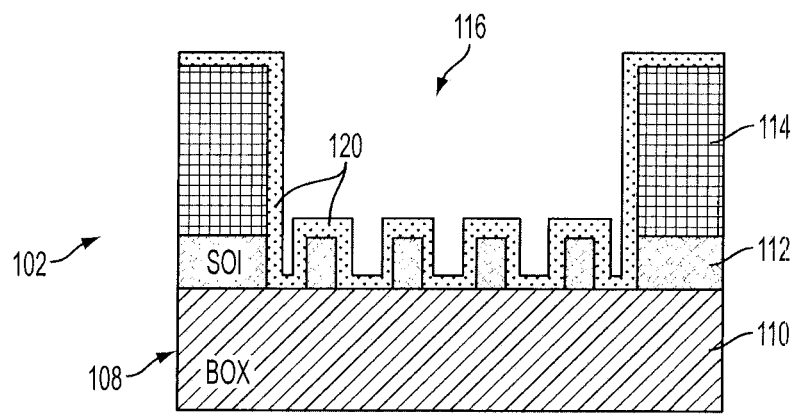
FIG. 5B is a cross sectional view in the second orientation illustrating the formation of the spacer layer over the device shown in FIG. 5A.
Figure 6A:
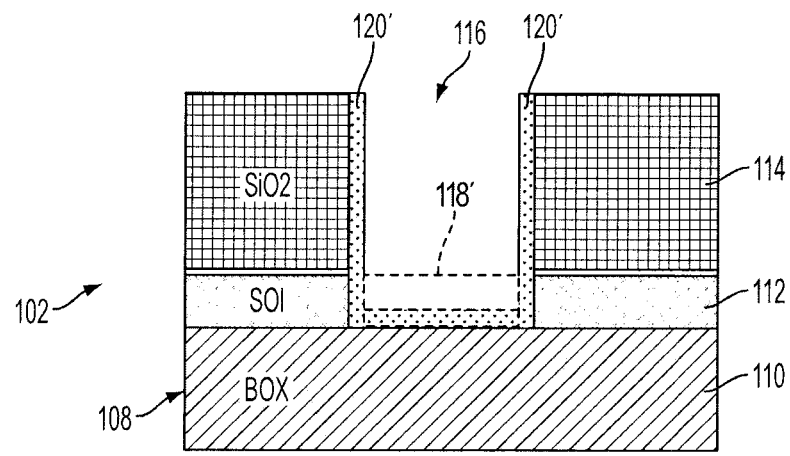
FIG. 6A is a cross sectional view in the first orientation illustrating the partial etching of the spacer layer shown in FIG. 5A.
Figure 6B:
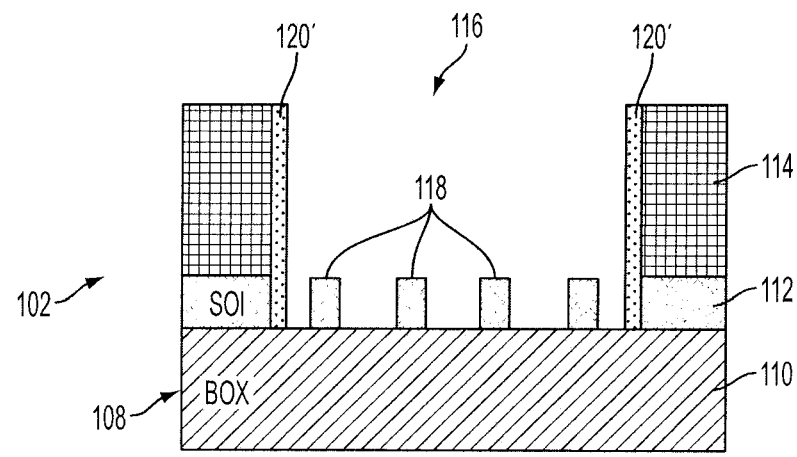
FIG. 6B is a cross sectional view in the second orientation illustrating the partial etching of the spacer layer shown in FIG. 6A.

Referring now to FIGS. 5A-5B, a spacer layer 120 may be disposed on the masking layer 114. More specifically, the spacer layer 120 may be deposited on an upper surface of the masking layer 114, and into the gate pocket 116 to cover the plurality of fins 118. The spacer layer 120 may be made, for example, of SiN. Thereafter, portions of the spacer layer 120 may be etched away to expose upper surfaces of the masking layer 114, as illustrated in FIGS. 6A-6B. Further, the spacer layer 120 may be etched away from the fins 118 and the surface of the gate pocket 116 to expose the buried oxide layer 110. Various etching techniques may be used to remove the spacer layer including, but not limited to, reactive-ion etching (RIE). Accordingly, the spacer layer 120 is left to remain on the wall 119 of the gate pocket 116 to define spacers 120'.

Referring now to FIGS. 7-14, a gate stack, i.e., gate, is formed in the gate pocket 116 of the SOI wafer 108 illustrated in FIGS. 6A-6B. The gate may be formed using a variety of conventional methods including, but not limited to, a replacement metal gate process, i.e., gate-last process.

Figure 7A:
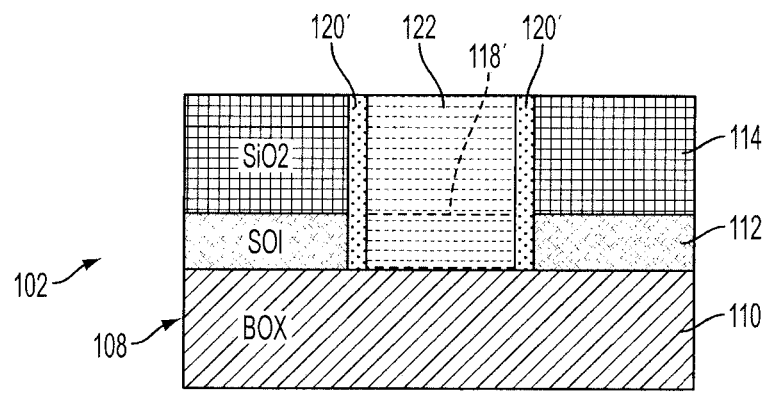
FIG. 7A is a cross sectional view in the first orientation, following a deposition of amorphous/polysilicon gate material in the gate pocket of the device illustrated in FIG. 6A.
Figure 7B:
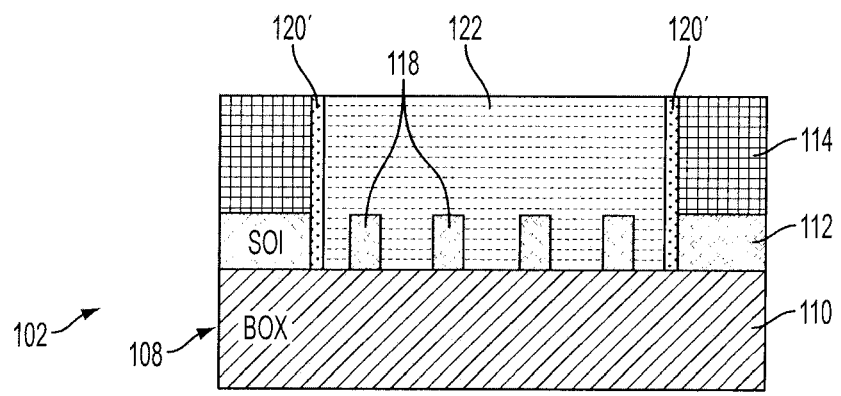
FIG. 7B is cross sectional view in the second orientation of the amorphous/polysilicon gate material deposited in the gate pocket of the device illustrated in FIG. 7A.

As illustrated in FIGS. 7A-7B, for example, a dummy gate 122 may be formed in the gate pocket 116. The dummy gate 122 may be formed of various material including, but not limited amorphous silicon and polysilicon. The dummy gate 122 may also be etched such that it is flush with the upper surface of the masking layer 114. Various methods for etching the dummy gate 122 may be used including, but not limited to, dry etching and chemical-mechanical polishing (CMP).

Figure 8A:
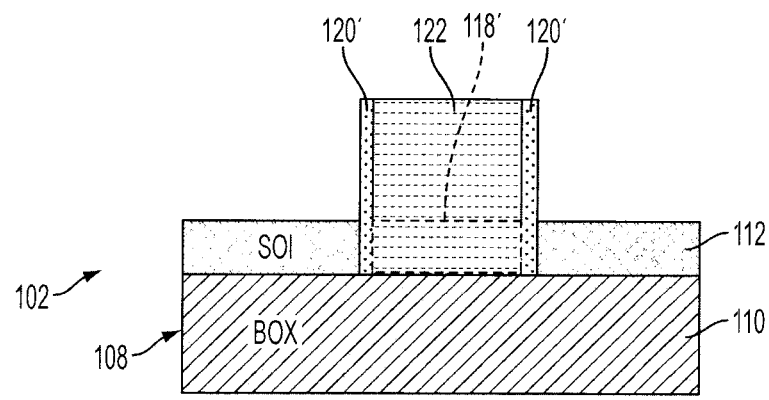
FIG. 8A is a cross sectional view in the first orientation of the device illustrated in FIG. 7A, following removal of the SiO$_2$ masking layer.
Figure 8B:
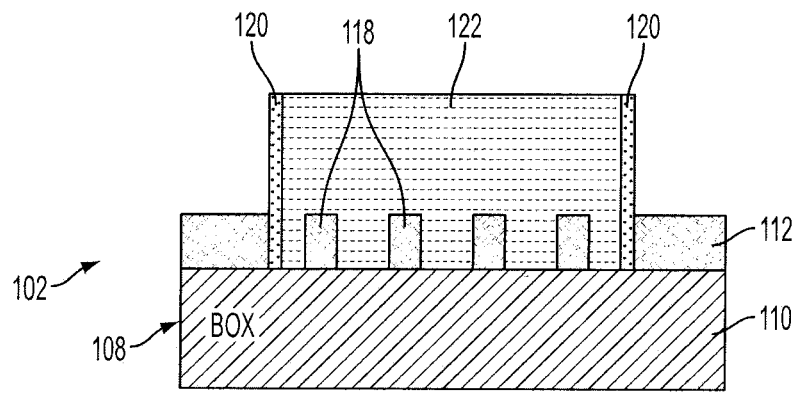
FIG. 8B is cross sectional view in the second orientation, following the removal of the SiO$_2$ masking layer illustrated in FIG. 8A.
Figure 9A:
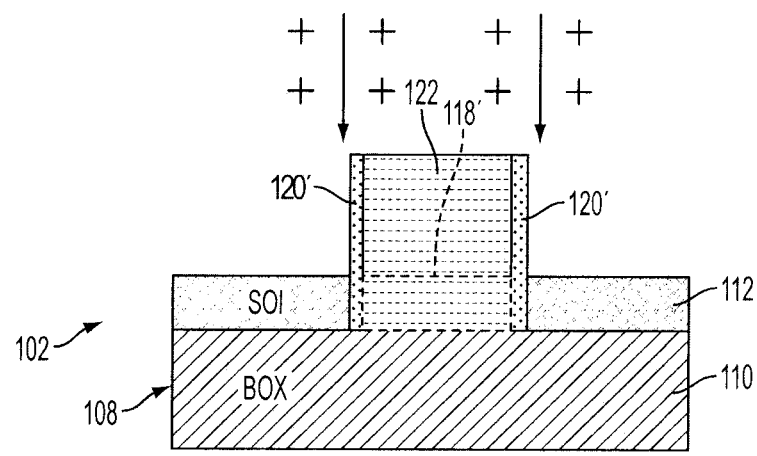
FIG. 9A is cross sectional view in the first orientation illustrating an extension ion implantation of the device shown in FIG. 8A.
Figure 9B:
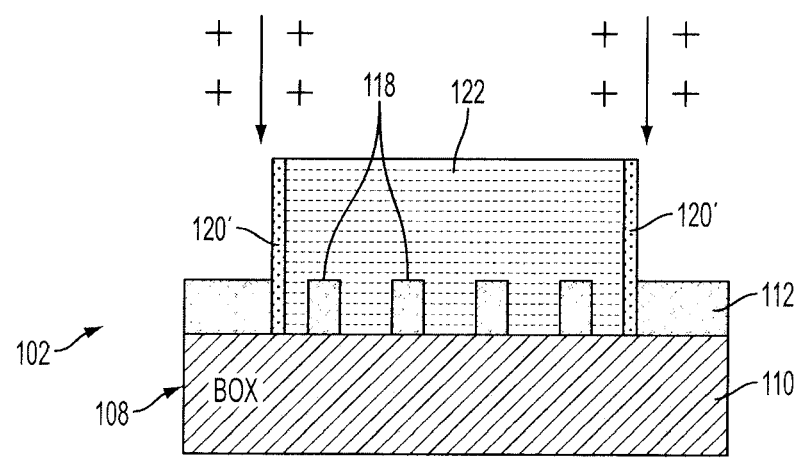
FIG. 9B is a cross sectional view in the second orientation illustrating the extension implantation of the device shown in FIG. 9A.
Figure 10A:
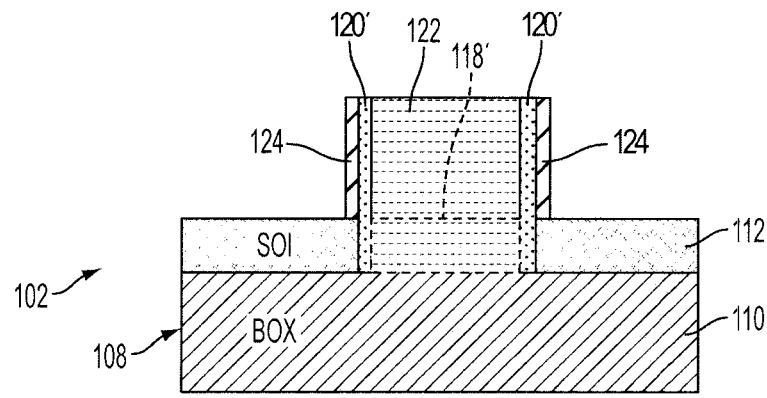
FIG. 10A is a cross sectional view in the first orientation, following deposition of a second spacer on the device shown in FIG. 9A.
Figure 10B:
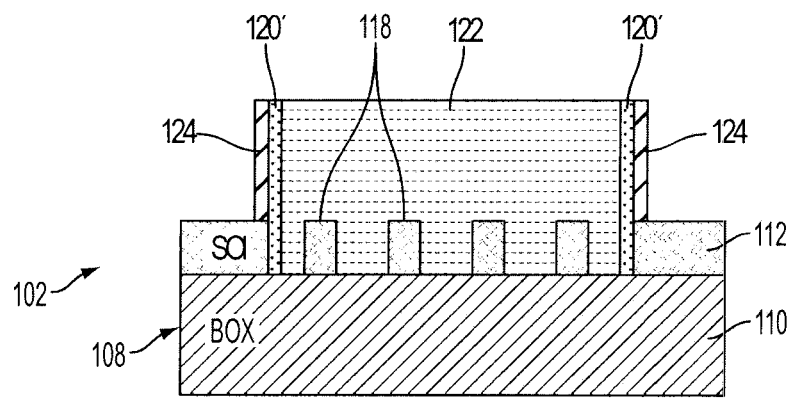
FIG. 10B is a cross sectional view in the second orientation illustrating the deposition of the second spacer shown on the device of FIG. 10A.
Figure 11A:
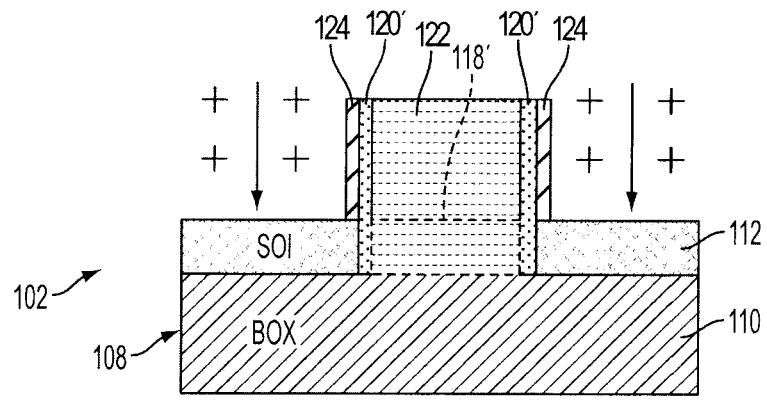
FIG. 11A is cross sectional view in the first orientation illustrating source/drain ion implantation of the device shown in FIG. 10A.
Figure 11B:
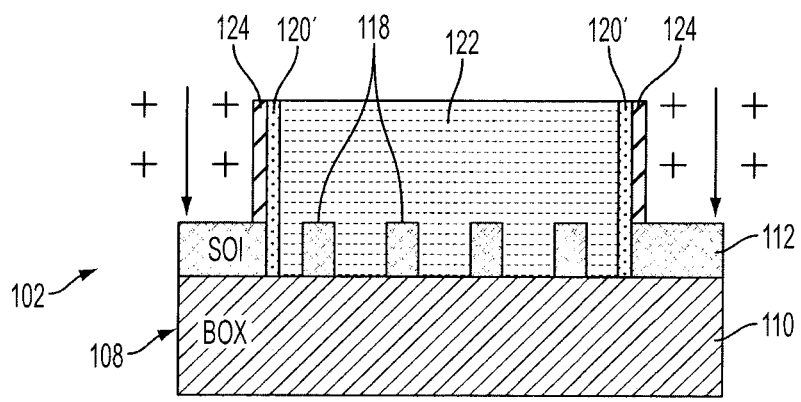
FIG. 11B is a cross sectional view in the second orientation illustrating the source/drain implantation of the device shown in FIG. 11A.
Figure 12A:
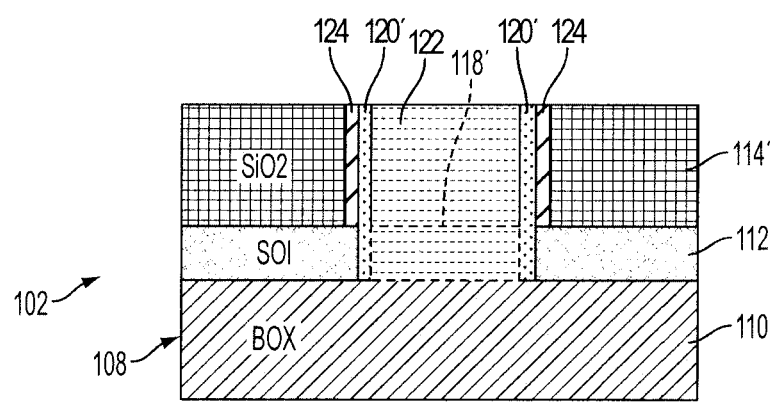
FIG. 12A is a cross sectional view in the first orientation, following a formation of a second SiO$_2$ hard mask formed on the device shown in FIG. 11A.
Figure 12B:
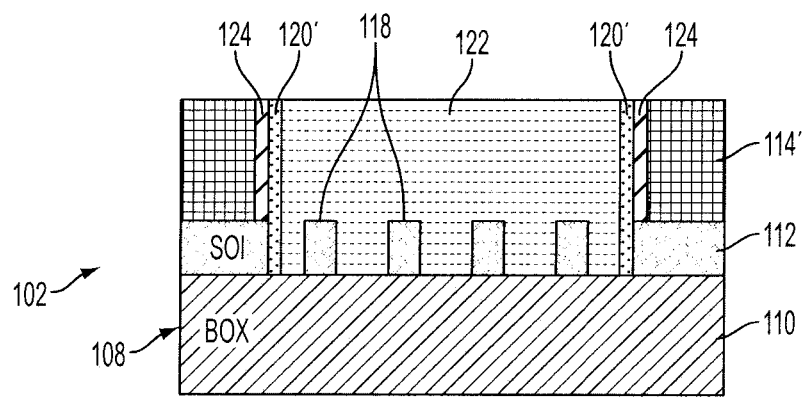
FIG. 12B is a cross sectional view in the second orientation of the second SiO$_2$ hard mask on the device shown in FIG. 12A.

Additional procedures during the replacement metal gate process may be performed on the semiconductor device 100. For example, the initial masking layer 114 may be removed to expose the spacers 120' disposed against the walls 119 of the gate pocket 116 as illustrated in FIGS. 8A-8B. An extension of the initial spacers 120' may be achieved by implanting ions (+), as illustrated in FIGS. 9A-9B. FIGS. 10A-10B illustrated a second spacer 124 formed against the initial spacer 120' to protect gate region 104 during S/D region 106/106' diffusion. Ion implantation (+) to form the S/D regions 106/106' is illustrated in FIGS. 11A-11B, and a new flowable oxide layer 114' such as silicon oxide ($SiO_2$) may be formed on an upper surface of the semiconductor, and may act as a new masking layer 114' as illustrated in FIGS. 12A-12B.

Figure 13A:
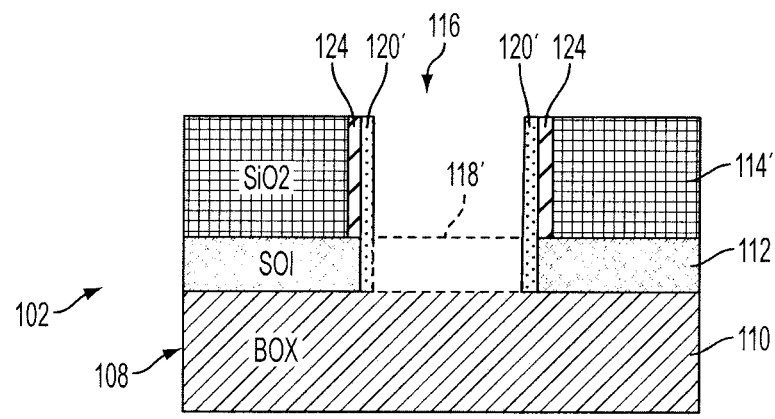
FIG. 13A is a cross sectional view in the first orientation following removal of the amorphous/polysilicon gate material to expose the gate pocket of the device illustrated in FIG. 12A.
Figure 13B:
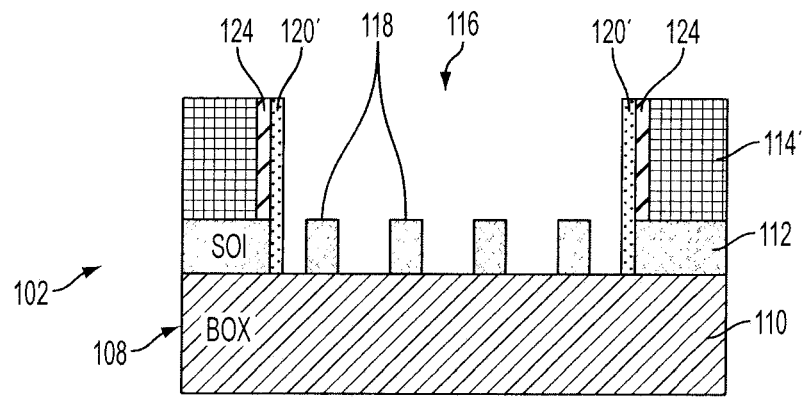
FIG. 13B is a cross sectional view in the second orientation following the removal of the amorphous/polysilicon gate material the device illustrated in FIG. 13A.
Figure 14A:
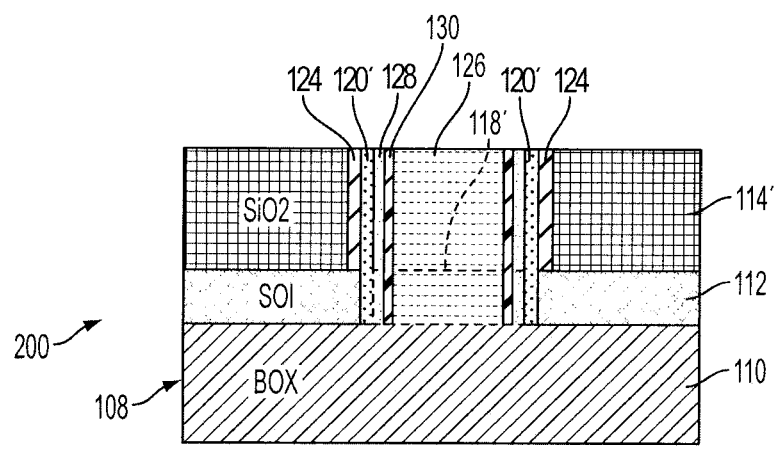
FIG. 14A is a cross sectional view in the first orientation, following a deposition of high-k and metal gate material in the gate pocket of the device illustrated in FIG. 13A.
Figure 14B:
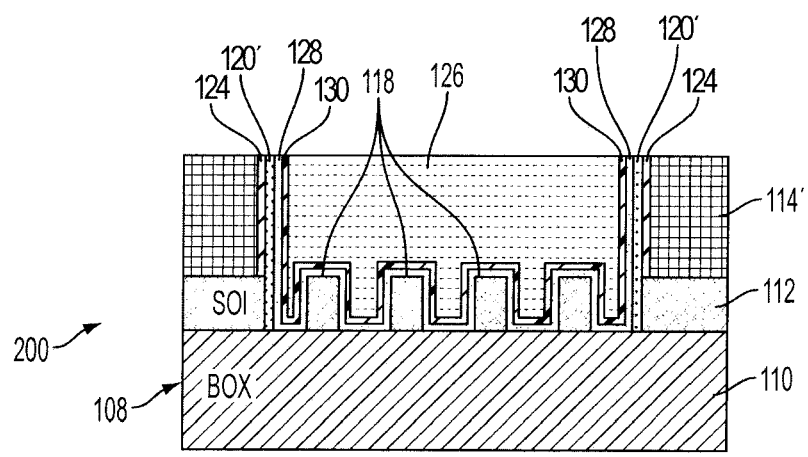
FIG. 14B is cross sectional view in the second orientation of the high-k and metal gate material deposited in the gate pocket of the device illustrated in FIG. 14A.

Referring now to FIGS. 13A-13B, the dummy gate 122 may be removed, i.e., pulled out, to re-expose the gate pocket 116, and a gate stack 126 may be formed in the re-exposed gate pocket 116, as illustrated in FIG. 14A-14B. The gate stack 126 may include a gate insulation layer 128 made of a high dielectric constant (high-k) material. The high-k material may include, but is not limited to, hafnium dioxide ($HfO_2$), hafnium silicon oxynitride (HfSiON), or zirconium dioxide ($ZrO_2$). The gate stack 126 may further include a metal electrode 130 coupled to the insulation gate layer to prevent Fermi-level pinning and increase electrical conduction at the gate stack 126. The metal electrode 130 may be formed of a metal-gate forming material including but not limited to, lanthanum (La), aluminum (Al), magnesium (Mg), ruthenium (Ru), titanium-based materials such as titanium (Ti) and titanium nitride (TiN), tantalum-based materials such as tantalum (Ta) and tantalum nitride (TaN) or tantalum carbide ($Ta_2C$), or the like. The gate stack 126 may be planarized using various processes including, but not limited to, CMP, such that the gate stack 126 is flush with new masking layer 114'.

Accordingly, FIGS. 14A-14B illustrate a fabricated semiconductor structure 100, such as a FinFET device 200 according to at least one exemplary embodiment of the present teachings. The FinFET device 200 includes an SOI wafer 108 having a plurality of fins 118 formed in only the gate pocket 116 of the gate region 104, which is located between the S/D regions 106/106'. That is, no fins 118 are formed in the S/D regions 106/106'. Therefore, the conventional process of epitaxially merging fins formed in the S/D regions may be eliminated from the fabrication process, thereby reducing overall processing and material costs. Further, since the gate patterning is initially performed in preparation for fin formation, the fins are prevented from being eroded during a gate patterning process.

In addition to forming fins in a gate region of a semiconductor substrate without forming fins in the non-gate regions, the present teachings allow for the formation of hanging fins and nanowire fins to produce a semiconductor FinFET device having a reduced size.

Referring to FIGS. 15-27, block diagrams corresponding to a process flow of fabricating a semiconductor structure 100, such as a FinFET device 300, are illustrated according to an exemplary embodiment of the present teachings. The process flow of fabricating the FinFET device 300 is similar to the process flow illustrated in FIGS. 1-14 discussed above. The FinFET device 300 includes an active SOI layer 112 formed between a buried insulation layer 110 and a masking layer 114.

Figure 15A:
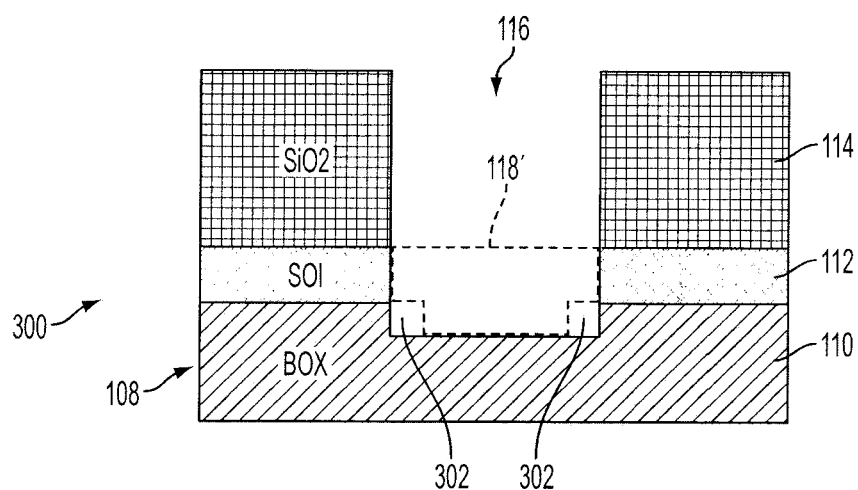
FIG. 15A is a cross sectional view in the first orientation after recessing the buried oxide layer below the semiconductor fins of the device illustrated in FIG. 3A according to another exemplary embodiment of the present teachings.
Figure 15B:
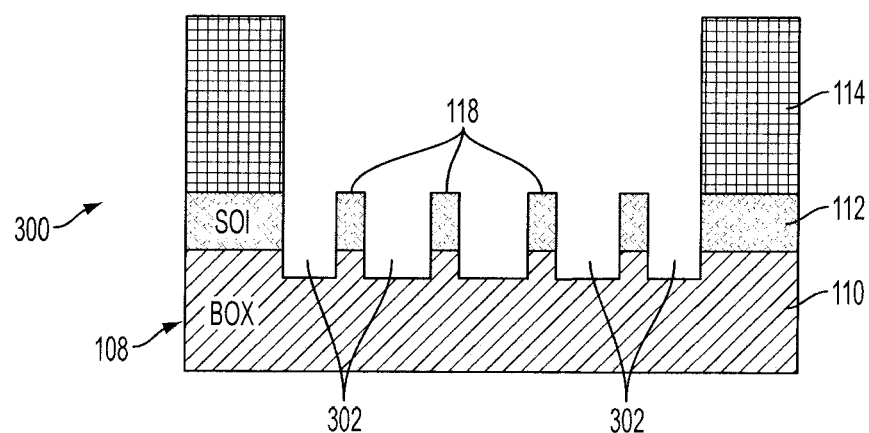
FIG. 15B is a cross sectional view in the second orientation illustrating the buried oxide layer below the semiconductor fins of the device illustrated in FIG. 15A.
Figure 16A:
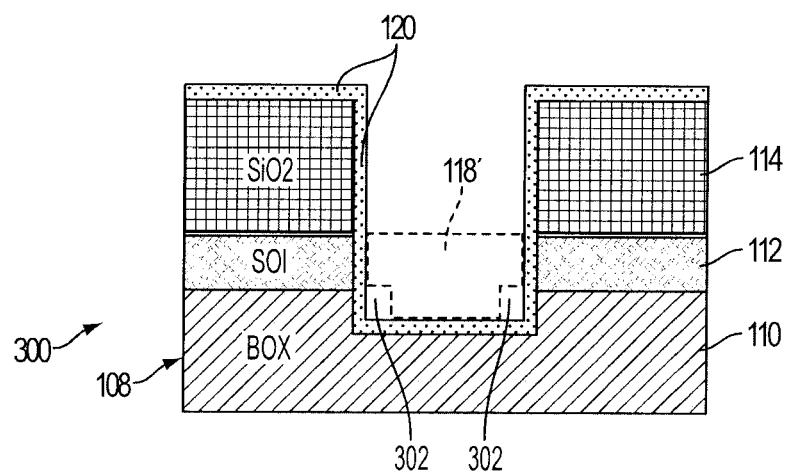
FIG. 16A is a cross sectional view in the first orientation illustrating the formation of a spacer layer over the device shown in FIG. 15A.
Figure 16B:
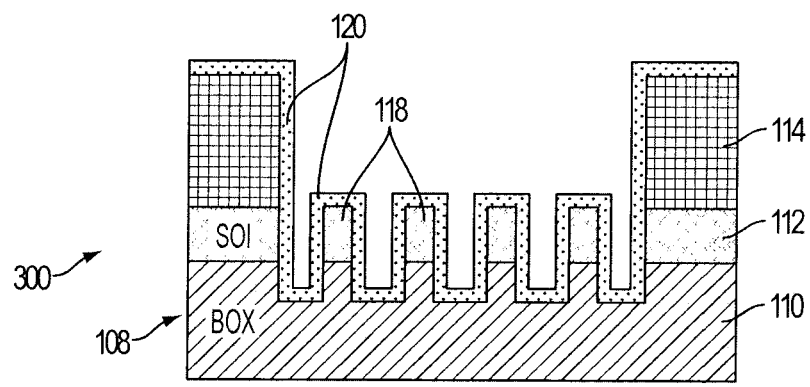
FIG. 16B is a cross sectional view in the second orientation illustrating the formation of the spacer layer over the device shown in FIG. 16A.
Figure 17A:
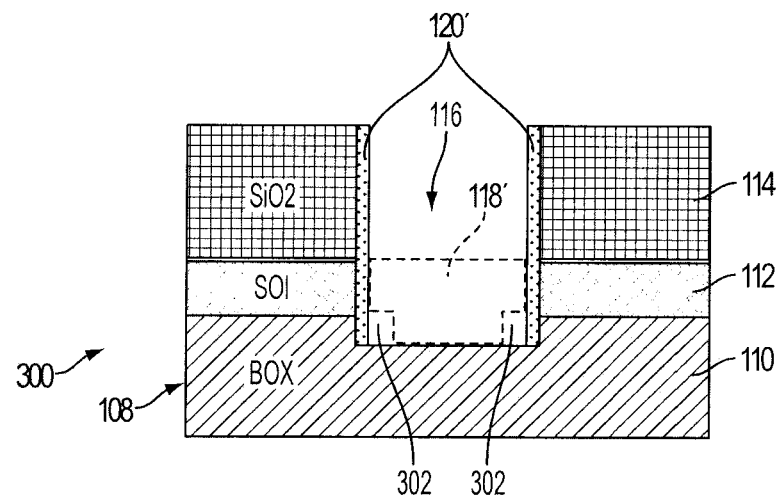
FIG. 17A is a cross sectional view in the first orientation illustrating the partial etching of the spacer layer shown in FIG. 16A.
Figure 17B:
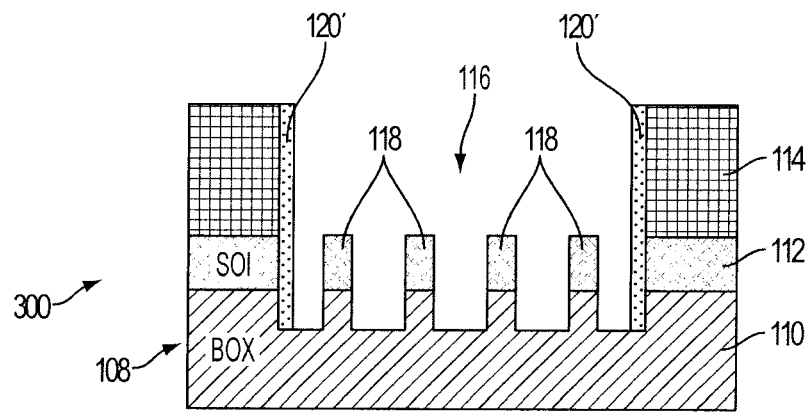
FIG. 17B is a cross sectional view in the second orientation illustrating the partial etching of the spacer layer shown in FIG. 17A.
Figure 18A:
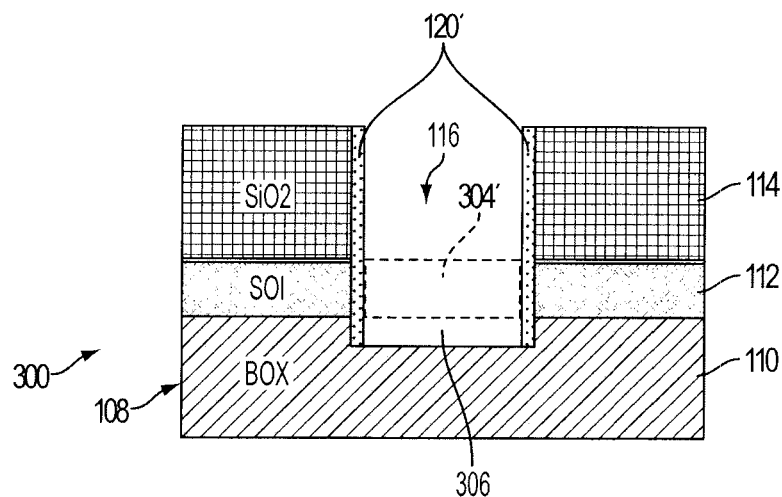
FIG. 18A is a cross sectional view in the first orientation illustrating removal of the buried oxide layer beneath the fins shown in FIG. 17A to form hanging fins.
Figure 18B:
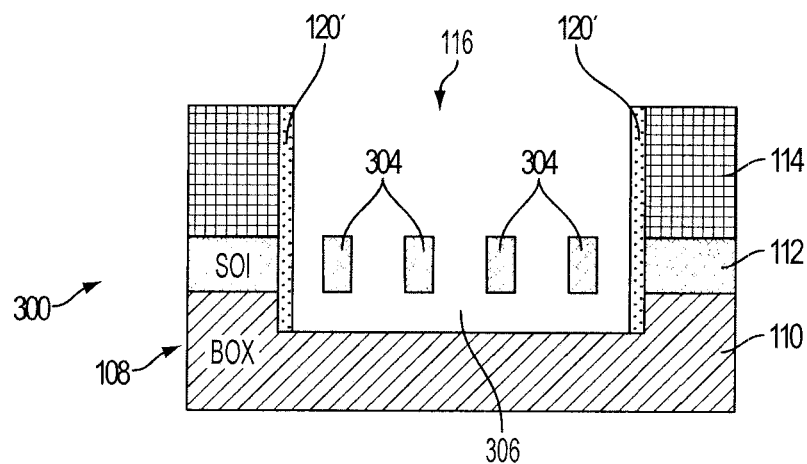
FIG. 18B is a cross sectional view in the second orientation illustrating the removal of the buried oxide layer to form the hanging fins of the device shown in FIG. 18A.

In at least one exemplary embodiment illustrated in FIG. 15A-15B, however, the buried insulation layer 110 is recessed below the active SOI layer 112 after forming the plurality of fins 118, thereby forming a recessed buried insulation region 302. After a spacer layer 120 is formed on the SOI substrate 108, and an etching procedure is performed to form spacers 120', as illustrated in FIGS. 16-17 according to the processes described above, a portion of the buried insulation layer 110 beneath the fins 118 is removed to form hanging fins 304, as illustrated in FIGS. 18A-18B. The hanging fins 304 are supported by walls 119 of the gate pocket 116, and are separated from the recessed buried insulation layer 302 by a predetermined distance. For example, the hanging fins may be separated from the recessed buried insulation layer by a distance of about 3 nanometers (nm) to about 20 nanometers (nm) such that a void area 306 is formed between a lower surface of the hanging fins 304 and the recessed buried insulation layer 302. Similar to the teachings described above, the walls 119 of the gate pocket 116 may isolate the hanging fins 304 from the non-gate regions 106/106', e.g., S/D regions, of the semiconductor structure 100.

Figure 19A:
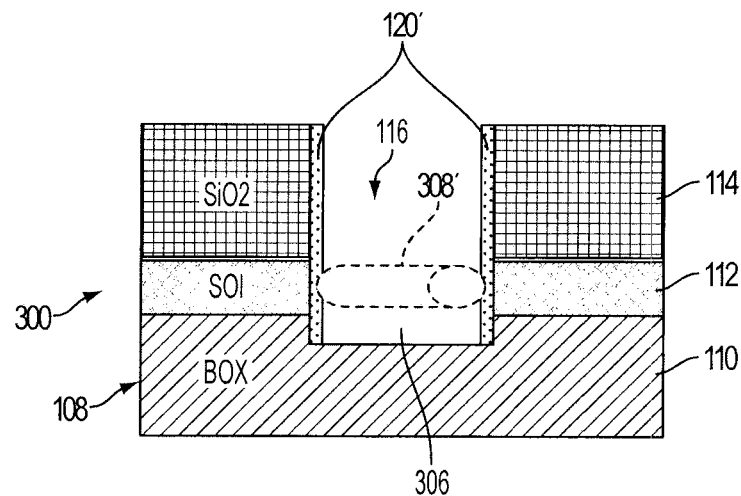
FIG. 19A is a cross sectional view in the first orientation, following an annealing process performed on the hanging fins shown in FIG. 18A to form nanowire fins.
Figure 19B:
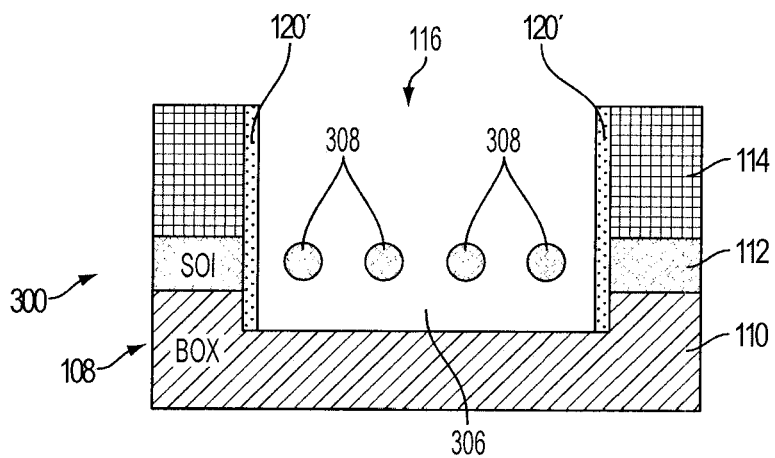
FIG. 19B is a cross sectional view in the second orientation illustrating the nanowire fins of the device shown in FIG. 19A.
Figure 20A:
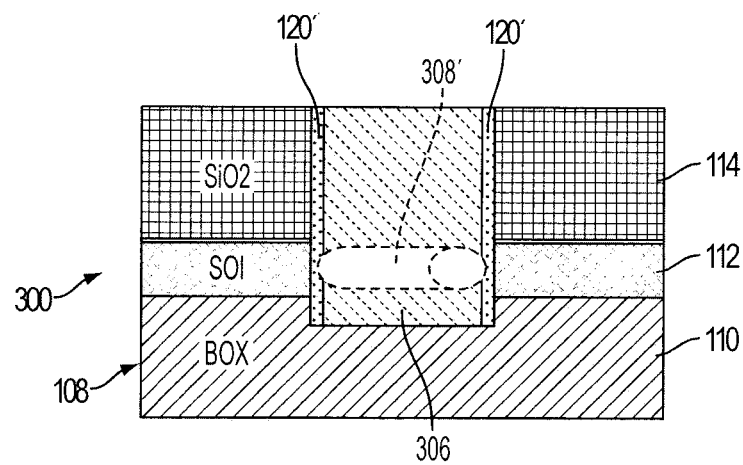
FIG. 20A is a cross sectional view in the first orientation, following a deposition of amorphous/polysilicon gate material in the gate pocket of the device illustrated in FIG. 19A.
Figure 20B:
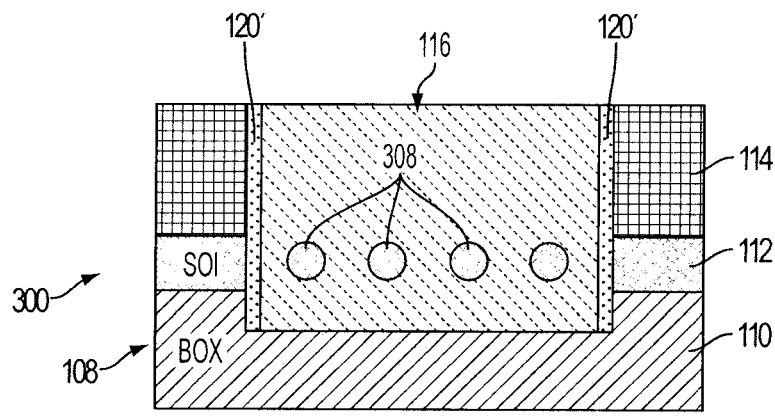
FIG. 20B is cross sectional view in the second orientation of the amorphous/polysilicon gate material deposited in the gate pocket of the device illustrated in FIG. 20A.
Figure 21A:
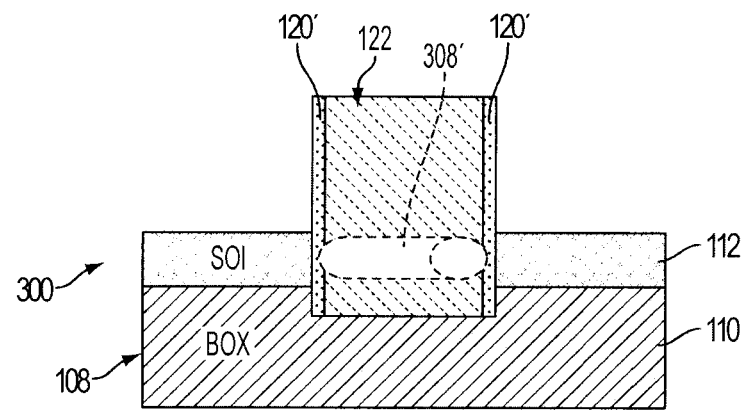
FIG. 21A is a cross sectional view in the first orientation, following removal of the SiO$_2$ masking layer shown in FIG. 20A.
Figure 21B:
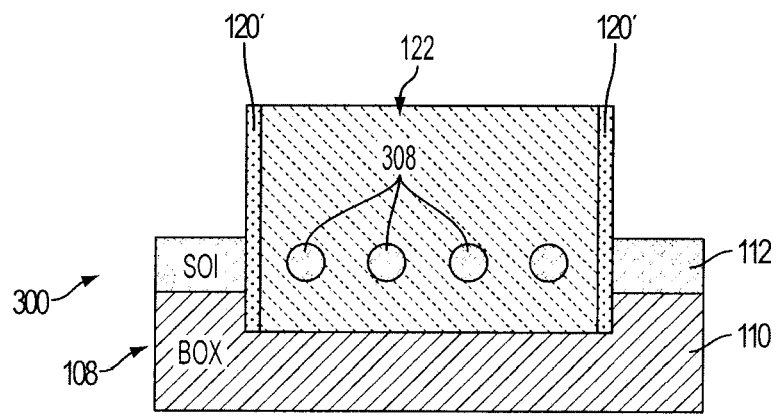
FIG. 21B is cross sectional view in the second orientation, following the removal of the SiO$_2$ masking layer illustrated in FIG. 21A.
Figure 22A:
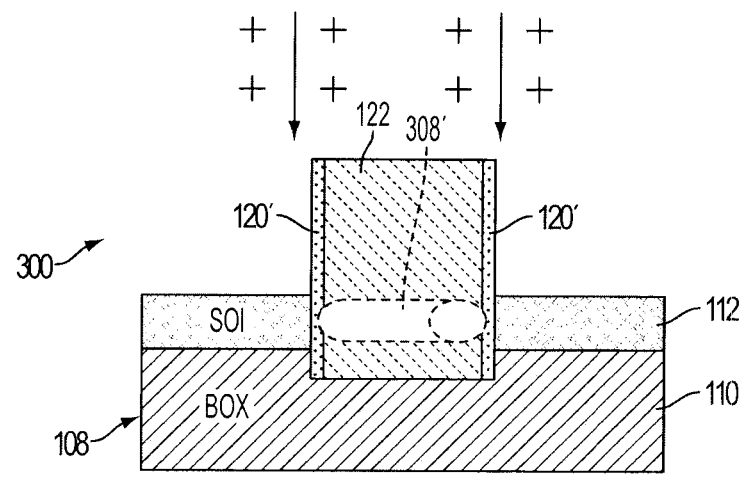
FIG. 22A is cross sectional view in the first orientation illustrating an extension ion implantation of the device shown in FIG. 21A.
Figure 22B:
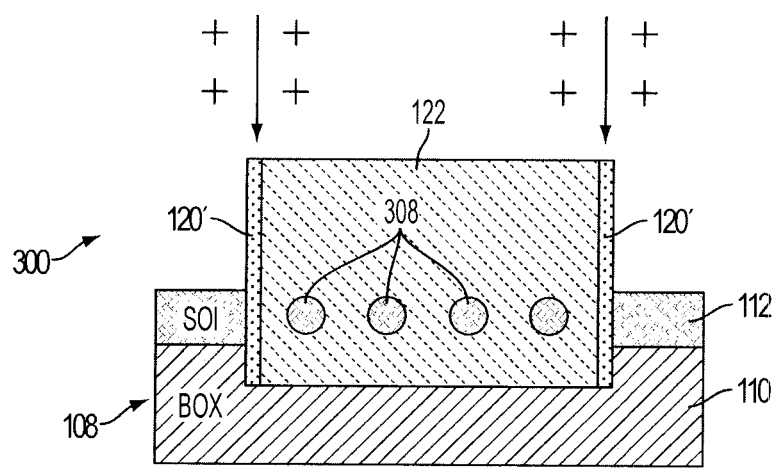
FIG. 22B is a cross sectional view in the second orientation illustrating the extension implantation of the device shown in FIG. 22A.
Figure 23A:
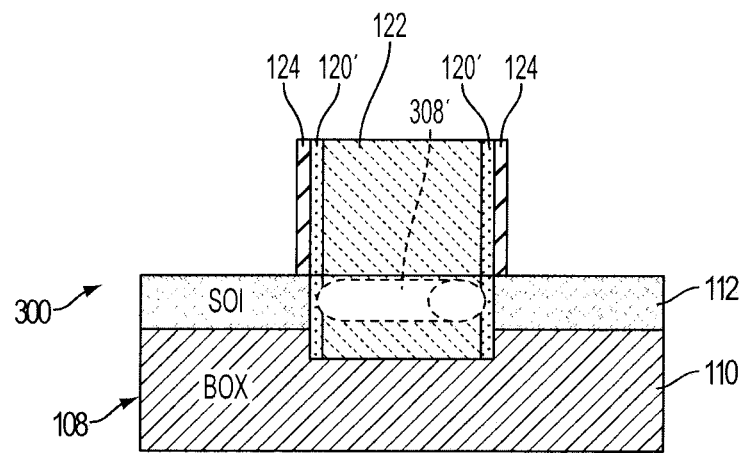
FIG. 23A is a cross sectional view in the first orientation, following deposition of a second spacer on the device shown in FIG. 22A.
Figure 23B:
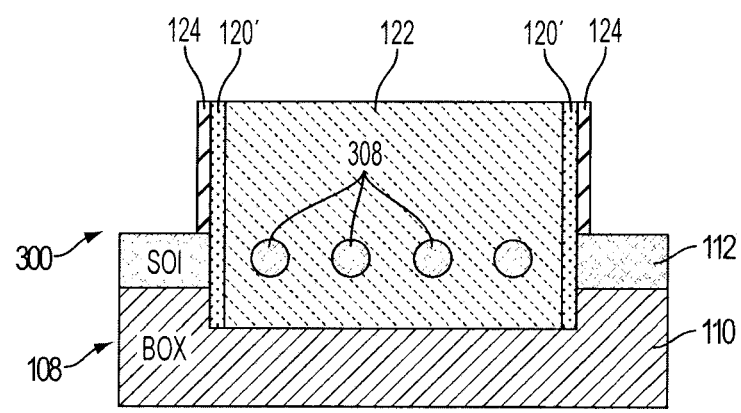
FIG. 23B is a cross sectional view in the second orientation illustrating the deposition of the second spacer shown on the device of FIG. 23A.
Figure 24A:
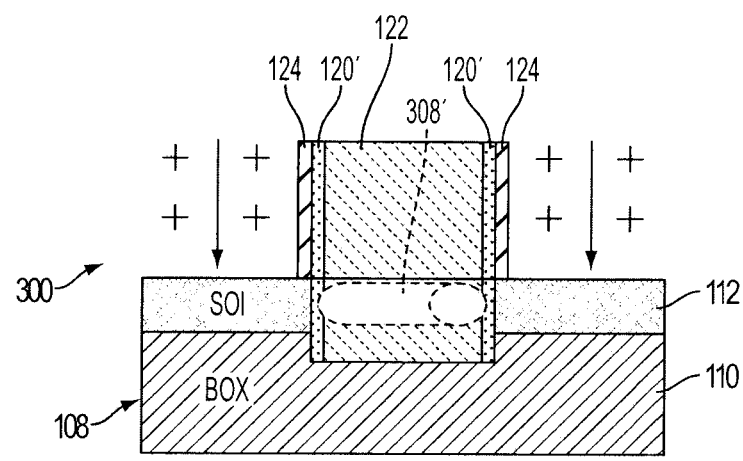
FIG. 24A is cross sectional view in the first orientation illustrating source/drain ion implantation of the device shown in FIG. 23A.
Figure 24B:
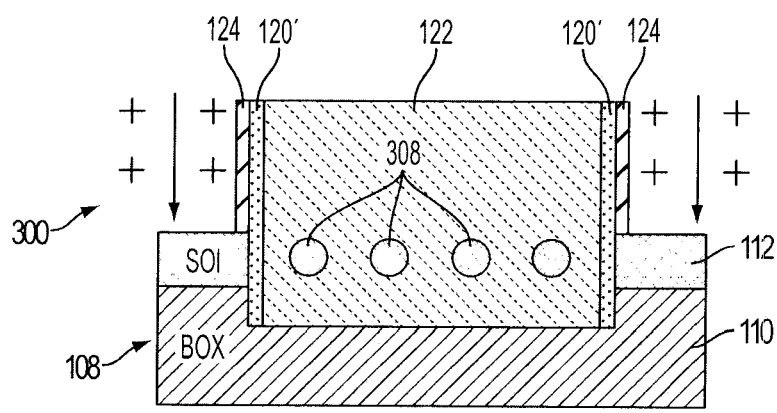
FIG. 24B is a cross sectional view in the second orientation illustrating the source/drain implantation of the device shown in FIG. 24A.
Figure 25A:
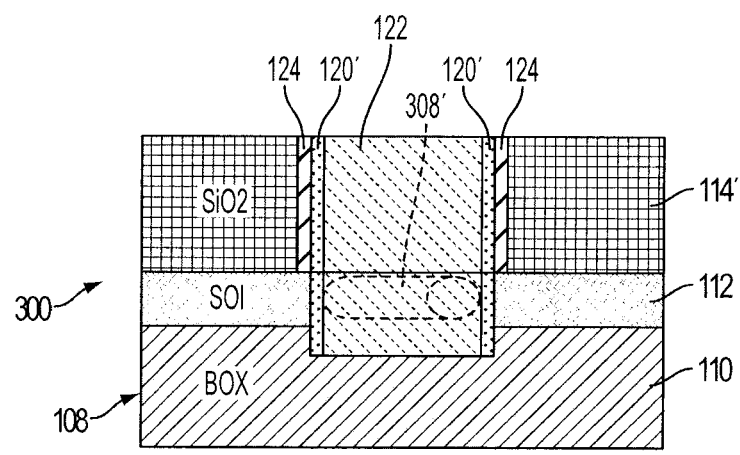
FIG. 25A is a cross sectional view in the first orientation, following a formation of a second $SiO_2$ hard mask on the device shown in FIG. 24A.
Figure 25B:
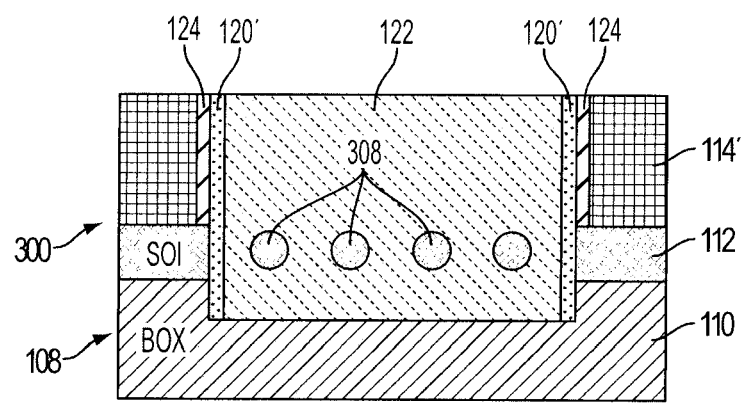
FIG. 25B is a cross sectional view in the second orientation, following the second $SiO_2$ hard mask formed on the device shown in FIG. 25B.
Figure 26A:
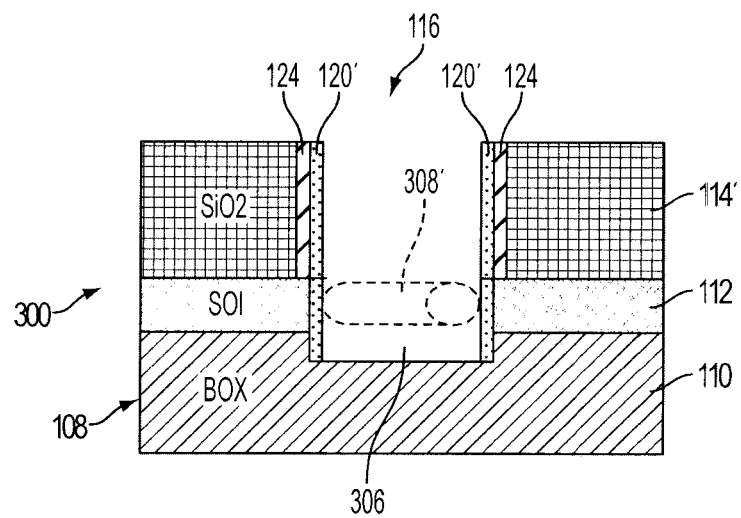
FIG. 26A is a cross sectional view in the first orientation following removal of the amorphous/polysilicon gate material to expose the gate pocket of the device illustrated in FIG. 25A.
Figure 26B:
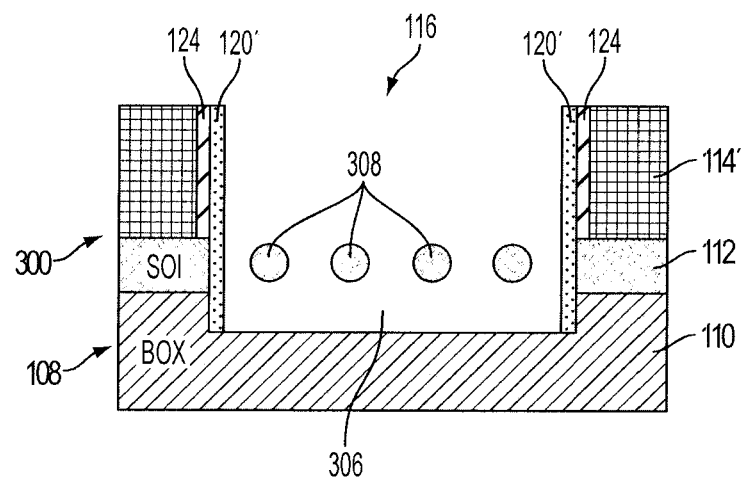
FIG. 26B is a cross sectional view in the second orientation following the removal of the amorphous/polysilicon gate material the device illustrated in FIG. 26A.
Figure 27A:
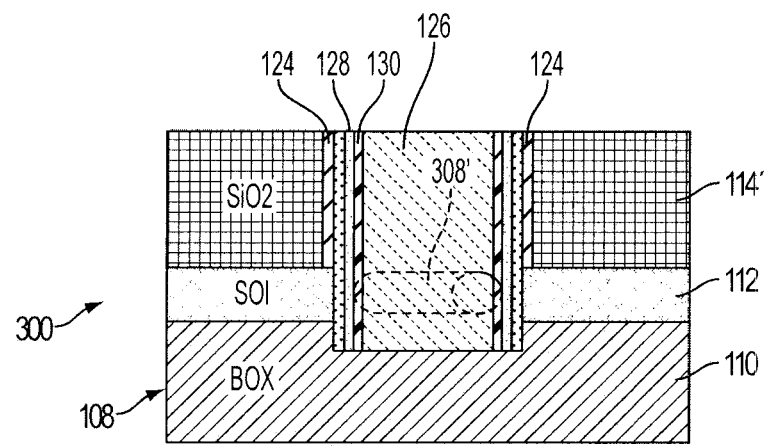
FIG. 27A is a cross sectional view in the first orientation, following a deposition of high-k and metal gate material in the gate pocket of the device illustrated in FIG. 26A.
Figure 27B:
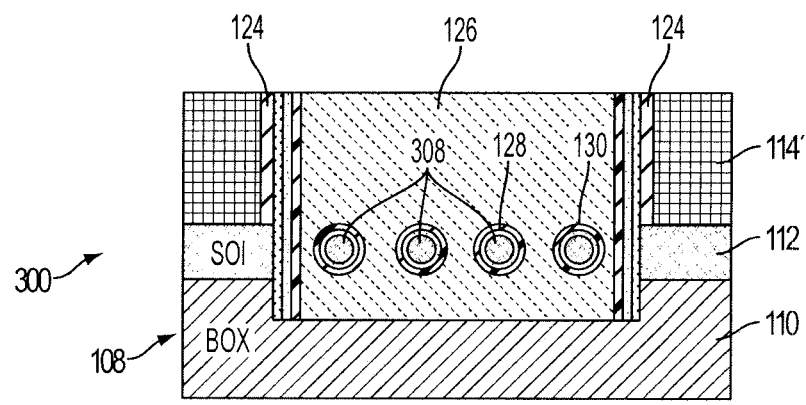
FIG. 27B is cross sectional view in the second orientation of the high-k and metal gate material deposited in the gate pocket of the device illustrated in FIG. 27A.

The hanging fins 304 may undergo an annealing process that forms nanowire fins, i.e., nanowires 308, as illustrated in FIGS. 19A-19B. According to at least one exemplary embodiment of the present teachings, the nanowires 308 have a cylindrical shape, but are not limited thereto. That is, the nanowires 308 may have any shape that allows for reducing the overall size of the semiconductor device 100. Furthermore, nanowires may be sized small enough that the resulting low density allows the nanowires to be considered as one-dimensional (1-D) nanostructures. Therefore, the dimensions of the nanowires 308 may be based on a diameter:length aspect ratio. According to at least one exemplary embodiment of the present teachings, the nanowires 308 have a diameter:length aspect ratio of about 1:1. Due to the small diameter of the nanowires 308, the gate region 104 may be increased to cover a larger area of the semiconductor structure 100. For example, the semiconductor device may be designed according to a wrap-gate architecture such that the gate region 104, and thus the nanowires 308, wrap completely around the semiconductor structure 100, as opposed to only two gate regions offered by the traditional dual-gate FinFET architecture.

After the nanowires 308 are formed, the semiconductor device 100 may undergo replacement metal gate procedure and S/D region formation according to the process described above to form the gate stack 126 in the gate pocket 116 as illustrated in FIGS. 20-27.

Figure 28:
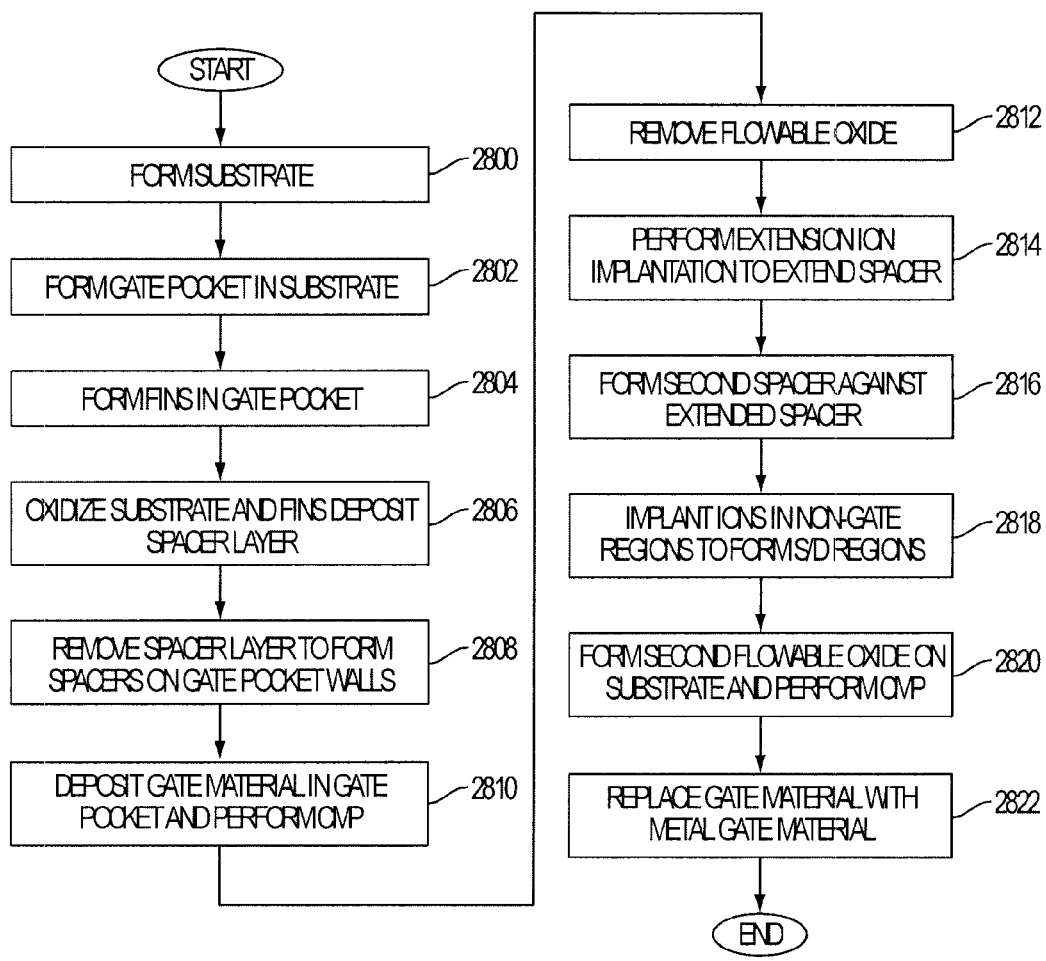
FIG. 28 is a flow diagram illustrating a method of fabricating a semiconductor structure according to an exemplary embodiment of the present teachings.

Referring to FIG. 28, a flow diagram illustrates a method of fabricating a semiconductor structure according to an exemplary embodiment of the present teachings. At operation 2800, a semiconductor substrate is formed. The semiconductor substrate may include a silicon-on-insulator (SOI). A gate pocket may be formed at a gate region of the semiconductor substrate at operation 2802. The gate pocket may extend through layers of the SOI substrate to expose an active silicon layer. At operation 2804, semiconductor fins are formed in the gate pocket. The fins may be supported by walls of the gate pocket. Moreover, walls of the gate pocket may isolate the plurality of fins from non-gate regions of the semiconductor substrate. For example, the gate pocket may isolate the fins from S/D regions of the semiconductor substrate. At operation 2806, the semiconductor substrate is oxidized to prepare the surface of the substrate for forming a spacer layer thereon. Accordingly, a spacer layer is formed on the semiconductor device such that the fins are covered. The spacer layer is removed from upper surfaces of the substrate and the fins at operation 2808, thereby leaving spacers disposed against walls of the gate pocket.

At operation 2810, a gate material is deposited in the gate pocket, which covers the fins. The gate material may also undergo chemical-mechanical polishing (CMP) procedure such that deposited gate material is flush with the upper surface of the semiconductor substrate. Flowable oxide, such as a silicon oxide ($SiO_2$) layer, which is disposed on the active silicon layer may be removed using conventional processes at operation 2812. At operation 2814, the semiconductor substrate may undergo an ion implantation to increase the volume of the spacers, and a second spacer may be formed against the extended spacer at operation 2816. At operation 2818, ions are implanted in the non-gate regions to form S/D regions. That is, a first non-gate region existing at first side of the gate region may be implanted with ions to form a source region, and a second non-gate region located on an opposite side of the gate-region may be implanted with ions to form a drain region. A second flowable oxide, such as $SiO_2$, is formed on an upper surface of the semiconductor substrate at operation 2820. At operation 2822, the gate material deposited in the gate pocket is removed to re-expose the gate pocket and fins, and metal gate replacement process is performed such that a metal gate material different from the gate material utilized at operation 2810 is deposited in the gate-pocket to cover the fins, and the method ends.

Accordingly, fins may be formed in a gate region and between first and second S/D regions, without requiring fins to extend into the S/D regions of the semiconductor structure. Since no fins exist in the S/D regions, a merging procedure to merge the fins in the S/D regions is excluded. Further, since no etching procedure is required to etch fins merged in the S/D regions, erosion and damage of the fins existing in the source/drain region caused by a merged-fin etching process is prevented.

Figure 29:
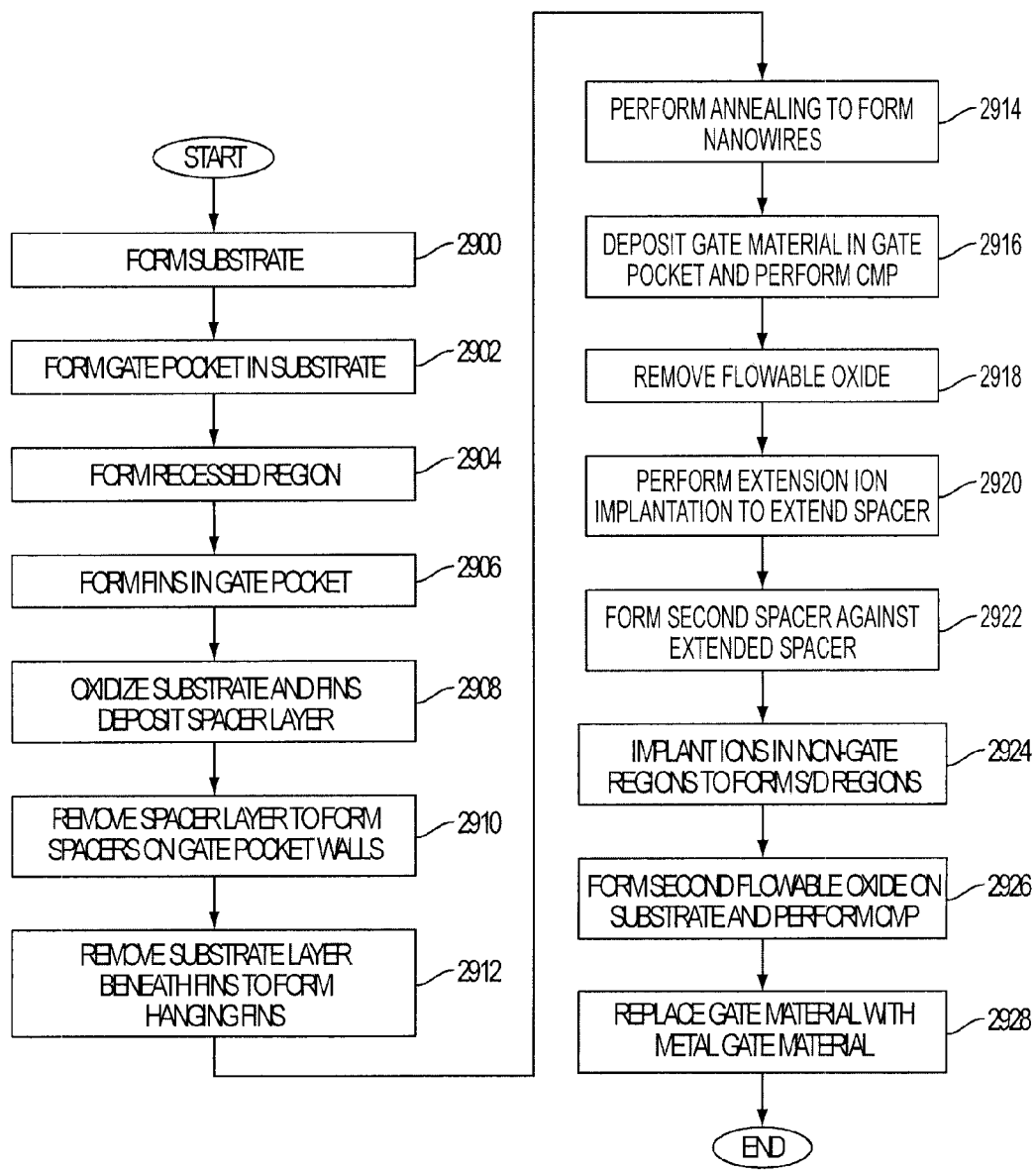
FIG. 29 is a flow diagram illustrating a method of fabricating a semiconductor structure according to another exemplary embodiment of the present teachings.

Referring to FIG. 29, a flow diagram illustrates another method of fabricating a semiconductor structure according to an exemplary embodiment of the present teachings. The exemplary method illustrated in FIG. 29 is similar to method illustrated in FIG. 28 discussed in detail above, but includes additional features of forming hanging fins and nanowires. More specifically, a semiconductor substrate, such as a SOI substrate, is formed and a gate pocket is formed at a gate region of the substrate at operations 2900 and 2902, respectively. At operation 2904, the gate pocket is recessed to form a recessed region in a layer of the substrate, for example the buried insulation layer. At operation 2906, semiconductor fins are formed in the gate pocket. The substrate and fins are oxidized and a spacer layer is formed thereon at operation 2908. At operation 2010, the spacer layer is partially removed to form spacers on the walls of the gate pocket. Turning now to operation 2912, a portion of the substrate located beneath the fins is removed to form hanging fins. Accordingly, a void area is defined between the recessed layer of the gate pocket and the plurality of fins such that a plurality a hanging fins are formed. The hanging fins undergo an annealing process at operation 2914, which transforms the hanging fins into nanowire fins, i.e., nanowires. A dummy gate is formed at operation 2916 by depositing an amorphous and/or polysilicon in the gate pocket at operation 2916. At operation 2918 the initial hardmask layer may be removed, and the spacers may be extended via ion implantation at operation 2920. A second spacer may be disposed against each of the initial spacers at operation 2922. At operation 2924, the source/drain regions may be formed via ion implantation and a second hardmask may be formed on an upper surface of the substrate at operation 2926. At operation 2928, a replacement metal gate process may be performed to form a metal gate in the gate pocket, and method ends. By forming nanowires in the gate pocket, the gate region of the semiconductor structure may be increased to cover a larger area of the semiconductor structure. Therefore, the overall size of the semiconductor structure may be reduced.

The terminology used herein is for the purpose of describing exemplary embodiments only and is not intended to be limiting of the teachings. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The flow diagrams depicted herein are just one example. There may be many variations to this diagram or operations described therein without departing from the spirit of the teachings. For instance, the operations may be performed in a differing order or operations may be added, deleted or modified. All of these variations are considered a part of the claimed teachings.

While exemplary embodiments to the present teachings have been described, it will be understood that those skilled in the art, both now and in the future, may make various changes the teachings which fall within the scope of the claims described below.

The invention claimed is:

1. A method of fabricating a semiconductor device, comprising:
    forming a semiconductor substrate including a plurality of layers and a gate region located between first and second non-gate regions that are different from the gate region, the first and second non-gate regions formed atop an insulation layer and having a non-etched upper surface extending along a length of the insulation layer to define a non-gate insulation length;
    forming a gate pocket at the gate region, the gate pocket extending through the plurality of layers; and
    forming a plurality of fins in the gate pocket to define a fin length that extends perpendicular to a width of the insulation layer and parallel to the non-gate insulation length such that each fin among the plurality of fins is isolated from the first and second non-gate regions;
    forming a first spacer which covers the plurality of fins in the gate pocket;
    etching a portion of the first spacer which covers the plurality of fins in the gate pocket;
    forming a dummy gate in the gate pocket after etching the portion of the first spacer;
    forming a second spacer on a side of the first spacer adjacent to the non-gate region;
    removing the dummy gate in the gate pocket before a gate stack is formed;
    forming the gate stack in the gate pocket on the first spacer on a side opposing the second spacer; and
    forming a metal electrode within the gate stack on the side opposing the second spacer,
    wherein the fin length of each fin formed in the gate pocket does not extend beyond the first spacer,
    the forming the first spacer within the gate pocket further comprises depositing a spacer layer of the first spacer which covers the plurality of fins within the gate pocket, and
    the metal electrode covers sidewalls and a top surface of the plurality of fins within the gate pocket.

2. The method of claim 1, forming the first spacer further comprises etching the spacer layer to form the first spacer against walls of the gate pocket.

3. The method of claim 2, forming the gate stack further comprises depositing a gate material in the gate pocket to cover the plurality of fins.

4. The method of claim 3, further comprising doping the first and second non-gate regions after the forming a plurality of fins is performed.

5. The method of claim 1, wherein the second spacer is formed on exposed sides of the first spacer.

6. The method of claim 1, further comprising forming a dummy gate in the gate pocket prior to forming the second spacer.

7. The method of claim 6, further comprising extending the first spacer by ion implantation.

8. The method of claim 6, wherein the second spacer is formed on the first spacer at a location higher than a height of the plurality of fins.

9. The method of claim 6, wherein the first spacer is formed on a wall of the gate pocket and the first spacer contacting the gate region and the first and second non-gate regions to isolate each fin among the plurality of fins from the first and second non-gate regions; and the second spacer is formed on exposed sides of the first spacer, the exposed sides of the first spacer being opposite the gate pocket.

10. The method of claim 1, further comprising forming a gate insulator layer between the metal electrode and the first spacer.

11. The method of claim 10, wherein the gate insulation layer comprises a high dielectric constant which includes hafnium silicon oxynitride, and the metal electrode comprises tantalum carbide.

12. The method of claim 10, wherein the gate insulator layer covers the sidewalls and the top surface of the plurality of fins within the gate pocket.

13. The method of claim 12, wherein the metal electrode covering the sidewalls and the top surface of the plurality of fins within the gate pocket is directly over the gate insulator layer covering the sidewalls of the top surface of the plurality of fins within the gate pocket.

14. The method of claim 13, wherein the second spacer is between the first spacer and a flowable oxide layer.

15. The method of claim 1, wherein the first and second non-gate regions comprise a masking layer including silicon dioxide which is directly over a top surface of an active silicon-on-insulator (SOI) layer.

16. The method of claim 1 further comprising:
    forming an active silicon-on-insulator (SOI) layer on the insulation layer in the first and second non-gate regions;
    ion implanting to form source and drain regions in the first and second non-gate regions; and
    forming a masking layer on the SOI layer after the ion implanting to form source and drain regions in the first and second non-gate regions.

17. The method of claim 16, further comprising:
    implanting another plurality of ions to extend the first spacer; and
    forming a gate insulator layer between the metal electrode and the first spacer, the gate insulator layer comprising zirconium dioxide.

18. The method of claim 17, wherein the gate pocket is formed by a sidewall image transfer (SIT) process to extend through the masking layer and the SOI layer, and the fins comprise a single crystal semiconductor material and are formed by a sidewall image transfer (SIT) process with a fin pitch from about 8 nm to about 50 nm.

* * * * *